US007650271B2

(12) United States Patent
O'Mahony et al.

(10) Patent No.: US 7,650,271 B2
(45) Date of Patent: Jan. 19, 2010

(54) TIME-DOMAIN DEVICE NOISE SIMULATOR

(75) Inventors: Frank P. O'Mahony, Portland, OR (US); Haydar Kutuk, Portland, OR (US); Bryan K. Casper, Hillsboro, OR (US); Eyal Fayneh, Givatayim (IL); Sivakumar Mudanai, Hillsboro, OR (US); Wei-kai Shih, Portland, OR (US); Farag Fattouh, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 599 days.

(21) Appl. No.: 11/395,537

(22) Filed: Mar. 31, 2006

(65) Prior Publication Data

US 2007/0233444 A1 Oct. 4, 2007

(51) Int. Cl.
*G06F 17/50* (2006.01)
(52) U.S. Cl. .................................. 703/14; 703/4; 716/5
(58) Field of Classification Search .................... 703/14, 703/3, 13, 16, 4; 716/4, 5; 702/185; 324/754; 327/319
See application file for complete search history.

(56) References Cited

U.S. PATENT DOCUMENTS

| 5,682,336 | A | * | 10/1997 | Chian et al. .................... 703/3 |
| 6,031,406 | A | * | 2/2000 | Drost et al. .................. 327/319 |
| 6,556,954 | B1 | * | 4/2003 | Denk et al. .................. 702/185 |
| 6,671,663 | B1 | * | 12/2003 | Hellums et al. ............... 703/14 |
| 2002/0022951 | A1 | * | 2/2002 | Heijningen et al. ........... 703/16 |
| 2002/0147956 | A1 | * | 10/2002 | Gabara et al. .................. 716/4 |
| 2005/0005254 | A1 | * | 1/2005 | Hirano et al. .................. 716/5 |
| 2005/0156612 | A1 | * | 7/2005 | Pochmuller ................. 324/754 |

OTHER PUBLICATIONS

"Transient Noise Analysis", *Eldo's User's Manual*, v.6.0 1, (Jan. 2003),13-1 to 13-4.
Dong, Y. , et al., "Efficient Monte-Carlo Thermal Noise Simulation for Signma-Delta Modulator", *Custom Integrated Circuits Conference*, (1997),pp. 499-502.
Sifri, J, "Recent Advancements in RFIC Simulartion Technology For Analyzing Large RFICs", http://eesof.tm.agilent.com/pdf/agilent_2002_03.pdf.

* cited by examiner

*Primary Examiner*—Paul L Rodriguez
*Assistant Examiner*—Kandasamy Thangavelu
(74) *Attorney, Agent, or Firm*—Ryder, Lu, Mazzeo and Konieczny, LLC; Douglas J. Ryder (57) ABSTRACT

In general, in one aspect, the disclosure describes a simulator for emulating various types of device noise in time-domain circuit simulations. The simulator is capable of adding noise to transistors as well as passive elements like resistors. The simulator utilizes at least one current source in parallel to a device to emulate the noise. The current source generates a random current output to emulate the device noise based on a random Gaussian number and the standard deviation of the device noise. The noise standard deviation can be determined based on the noise power spectral density of the device having a particular bias at that simulation time and the update time. The simulator is capable of emulating any noise source with a constant or monotonically decreasing noise spectrum (e.g., thermal noise, flicker noise) by utilizing multiple current sources having different update steps. The simulator is compatible with standard circuit simulators.

14 Claims, 12 Drawing Sheets

FIG. 8

TIME-DOMAIN DEVICE NOISE SIMULATOR

BACKGROUND

Circuits may often be designed and tested using simulators prior to fabricating the circuits. The simulators may include a library of devices and parameters associated with the devices that can be used to design the circuit. The simulators can ensure that the circuit performs as expected and may emulate different phenomenon that can affect the circuit's performance. The simulators may analyze the operation of the circuit at discrete time steps (time-domain simulators).

Noise is a phenomenon that may affect the operation of a circuit. The noise power generated by a particular device may be independent of the frequency of the device (thermal noise) or may be dependent on the frequency (flicker noise). Noise may be simulated in the frequency domain. Emulating noise based on frequency limits analysis to small signal device operations (AC) and is not valid for any non-linear circuit behavior. Noise may also be simulated for circuits with periodic behavior, for example analyzing an oscillator at different points in a period.

Emulating noise in time domain is desirable. It is desirable to have general purpose noise emulation capabilities to simulate noise in linear and non-linear circuits that could be either periodic or non-periodic.

BRIEF DESCRIPTION OF THE DRAWINGS

The features and advantages of the various embodiments will become apparent from the following detailed description in which.

DETAILED DESCRIPTION

Figure 1A:
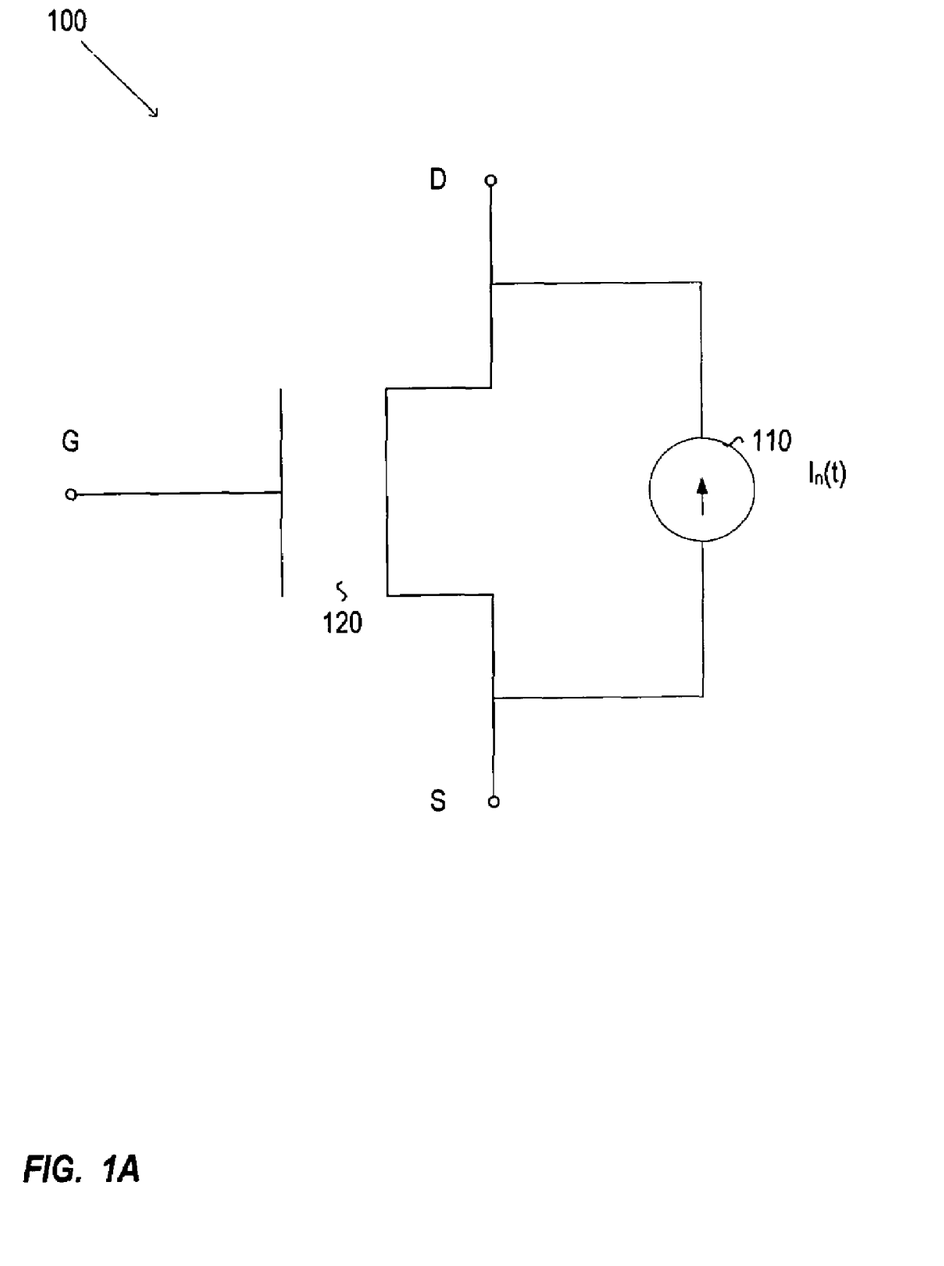
FIG. 1A illustrates an example time domain thermal noise simulation, according to one embodiment.

FIG. 1A illustrates an example time domain thermal noise simulation 100. The simulation 100 includes a simulated current source 110 in parallel with a simulated device channel (or resistor) 120. The simulation 100 utilizes the current source 110 to emulate device noise by injecting an appropriate random noise current to the device 120 at each time point. Although an instantaneous value of the device noise may not be known, a desired noise power spectral density ($S_{in}$) for the device noise may generally be known. The $S_{in}$ for a device 120 equals the amount of current power contained within a unit frequency interval ($i_n^2/\Delta f$). The $S_{in}$ may be known for various devices at different bias conditions. The $S_{in}$ may be available within circuit simulation engines (e.g., SPICE).

The simulator 100 may utilize the $S_{in}$ to determine the standard deviation of an instantaneous noise current ($\sigma_{in}$) of the device 120. The $\sigma_{in}$ for a particular simulation time step ($T_{step}$) is the square root of $S_{in}$ multiplied by the Nyquist bandwidth (1 divided by twice $T_{step}$), such that $\sigma_{in}=\sqrt{\{S_{in}/(2*T_{step})\}}$. The $\sigma_{in}$ may be used by the current source 110 to simulate noise currents for the device 120.

For example, thermal noise ($i_n$) is a white noise source meaning that its $S_{in}$ is independent of frequency. Thermal noise ($i_n$) may be simulated by generating a series of uncorrelated Gaussian values (N) having a standard deviation ($\sigma$) equal to 1 and multiplying N by the $\sigma_{in}$, such that $i_n=N*\sigma_{in}$. N may be generated by any suitable random number generator, including but not limited to a pseudo-random number generator. By generating N and utilizing N to simulate noise currents at each $T_{step}$, the thermal noise of the device 120 can be included in time-domain simulations.

Figure 1B:
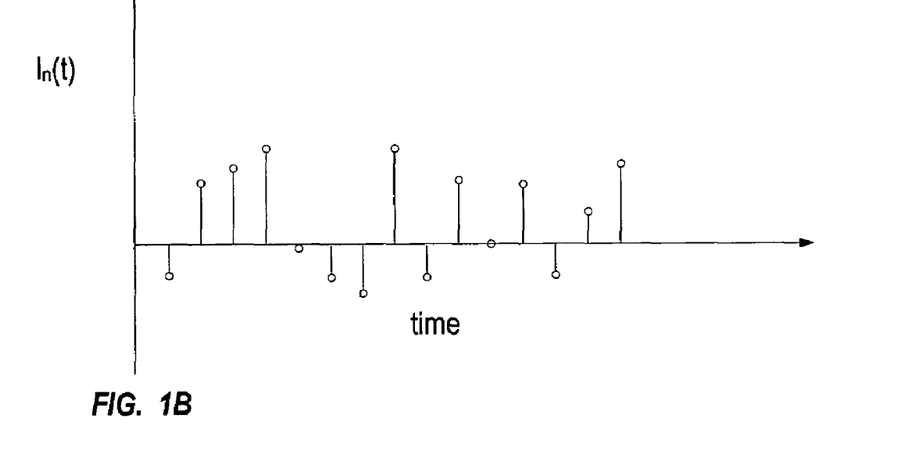
FIG. 1B illustrates an example time-domain current noise waveform, according to one embodiment.

FIG. 1B illustrates an example time-domain current noise waveform. An instantaneous current noise is generated for each discrete simulation time step.

In theory it may be suitable to simulate white noise by generating an instantaneous current noise each time step. However, it may be desirable to filter the noise because the simulation time step used by circuit simulators is not necessarily uniform throughout the simulation. If the noise current is updated at each step and each step is not uniform, then the noise bandwidth will vary as a function of time. Ideally, this bandwidth would be kept constant throughout the simulation. In cases where the simulator uses very small time steps to facilitate convergence, this direct connection between the time step and the noise bandwidth can lead to correspondingly large instantaneous currents. These potentially large instantaneous currents can exacerbate convergence issues since they will coincide with points where the time step has been reduced.

Accordingly, an update interval ($T_{update}$) may be added that sets how often the random noise current is updated and is independent of $T_{step}$. $T_{update}$ may initially be set to equal a nominal simulation time step $T_{step,nom}$. If there are no convergence issues and the simulation time is reasonable then this is a good setting. If simulations are slow or if they do not converge, then $T_{update}$ should be increased. $T_{update}$ may be updated to some multiple of $T_{step,nom}$, though it is not necessary that it be a multiple of $T_{step}$.

Figure 1C:
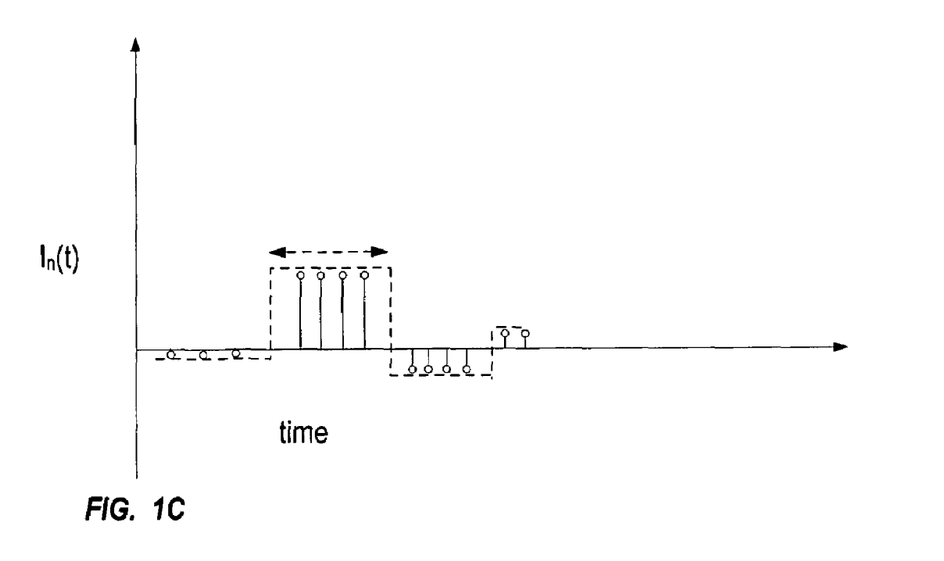
FIG. 1C illustrates an example time-domain current noise waveform generated at update intervals, according to one embodiment.

FIG. 1C illustrates an example time-domain current noise waveform generated at update intervals. The current generated does not get updated at each discrete $T_{step}$ but rather gets updated at the defined $T_{update}$ periods. A current is provided at each $T_{step}$, however a new current is only generated at each $T_{update}$ (the same current value may be maintained for multiple $T_{steps}$).

Setting the $T_{update}$ to be greater than the $T_{step}$ has the effect of filtering the white noise bandwidth and accordingly the PSD of the white noise. The white noise PSD (S) is frequency (f) independent while a filtered PSD ($S_{filt}$) is frequency dependent. The ratio of $T_{update}/T_{step}$ (M) is used to modify S to generate $S_{filt}$, such that $S_{filt}=S*[\sin(\pi fM)/\{M*\sin(\pi f)\}]$. Depending on convergence, some noise filtering can be used. The impact of the noise filtering depends on the bandwidth of the circuit that is being simulated. As long as the noise bandwidth ($1/T_{update}$) is greater than the circuit bandwidth ($1/T_{rise,fall}$), there will likely be no significant change in the circuit noise since the noise current above the circuit bandwidth gets filtered out anyway. Accordingly, $T_{update}$ should fall between $T_{step}$ and $T_{rise,fall}$, such that $T_{step} < T_{update} < T_{rise,fall}$.

Figure 2:
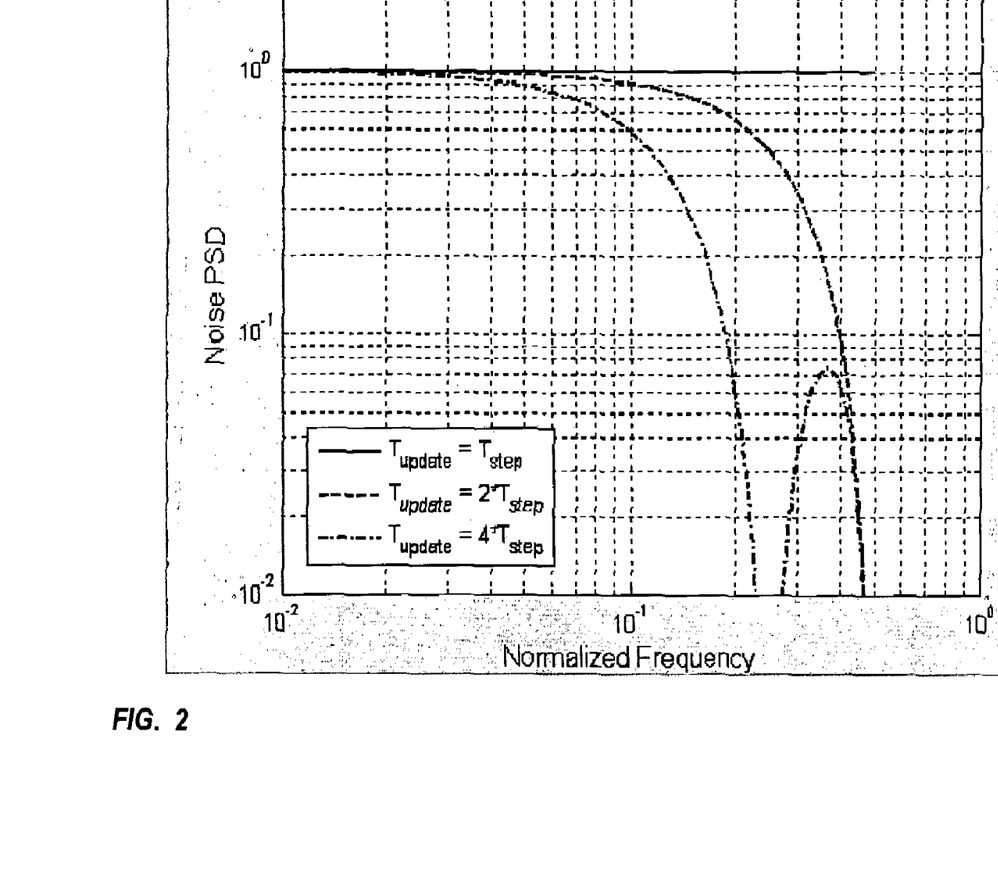
FIG. 2 illustrates example noise power spectral densities (PSDs) as a function of update interval ($T_{update}$), according to one embodiment.

FIG. 2 illustrates example noise PSDs as a function of $T_{update}$. The frequency axis is normalized to $1/T_{step}$. When $T_{update}$ and $T_{step}$ are equal, the noise PSD is independent of frequency and the noise spectrum is flat to the Nyquist bandwidth (0.5 as illustrated in FIG. 2).

When the update time is increased (e.g., $T_{update}=2*T_{step}$) the noise PSD decreases as the frequency increases.

Figure 3A:
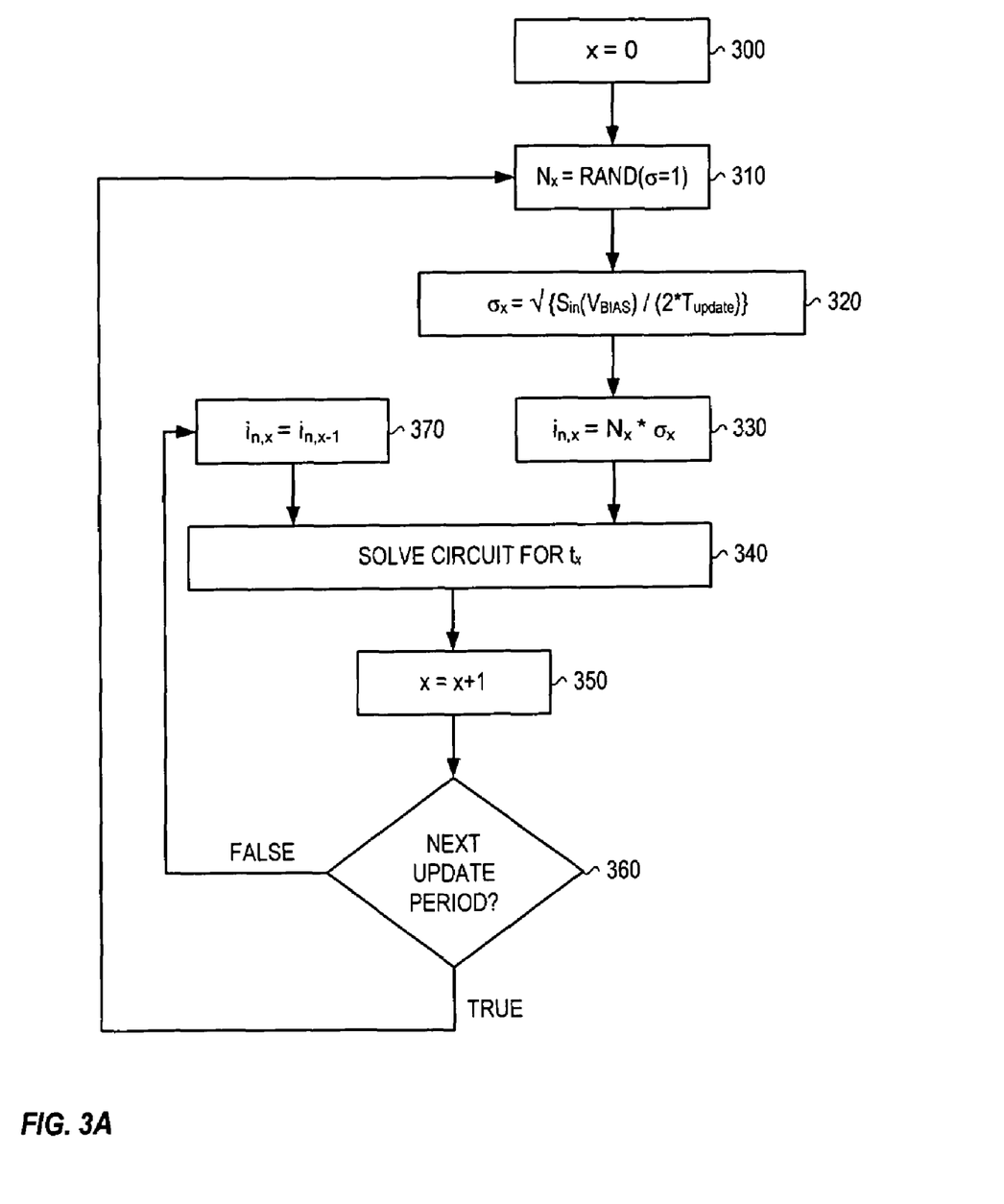
FIG. 3A illustrates an example computational flowchart for implementing a time-domain thermal noise simulation, according to one embodiment.

FIG. 3A illustrates an example computational flowchart for implementing a time-domain thermal noise simulation (e.g., 100 of FIG. 1A). For a first time step ($t_x$) a variable x is set to zero (300). A Gaussian distribution random number ($N_x$) is then generated with a standard deviation of 1 (310). A power spectral density ($S_{in}$) is retrieved for the component (or components) having particular voltage bias conditions ($V_{bias}$) at $t_x$. A noise current standard deviation for the time step ($\sigma_x$) is generated by taking the square root of $S_{in}$ divided by twice the update time ($T_{update}$), such that $\sigma_x=\sqrt{S_{in}/(2*T_{update})}$ (320). The noise current for the particular time step ($i_{n,x}$) is then determined by multiplying $N_x$ by $\sigma_x$ (330). The circuit is then solved for $t_x$ with the application of in $i_{n,x}$ (340).

At a next time step the variable x is increased by 1 (350). A determination is then made as to whether the next update period has been reached (360). If the next update period has been reached (360 True) a new random number is generated for $t_x$ (310). If the next update period has not yet been reached (360 False) a noise current for that time step in $i_{n,x}$ is set to the noise current for the previous time step $i_{n,x-1}$ (370).

According to one embodiment, the determination may be made by comparing the modula of the $T_{update}$ for $t_x$ and $t_{x-1}$. If $t_x\bmod(T_{update})$ is less than the $t_{x-1}\bmod(T_{update})$ the next update period has been reached as the modula will have wrapped back around to the beginning. For example, if $T_{update}$ is $4t_x$ the modula for $t_3$ will be 4 (the last time step in the update cycle) which is greater than the modula for $t_2$ which would be 3 indicating that a next update interval has not yet occurred. However, the modula for $t_4$ will be 1 (the first time step in a new update cycle) which is less than the modula for $t_3$ which would be 4 (the last time step in the previous update cycle) indicating that a next update interval has occurred.

Figure 3B:
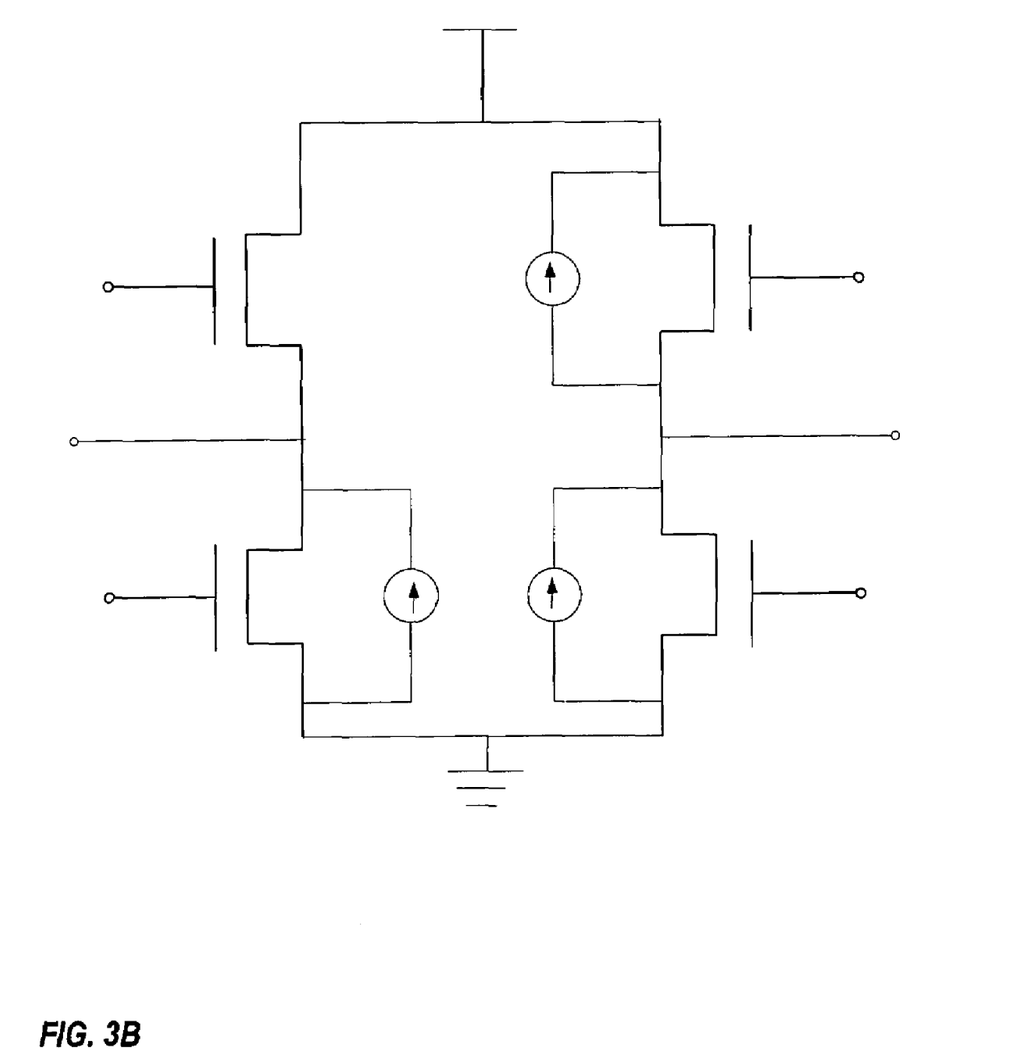
FIG. 3B illustrates an example time domain thermal noise simulation for a simulated circuit, according to one embodiment.

The flowchart of FIG. 3A simply described implementing a time-domain thermal noise simulation for a single simulated device. However, noise may be emulated for multiple simulated devices making up a simulated circuit. For example, FIG. 3B illustrates a simulated circuit having four simulated transistors coupled together. Three of the simulated transistors have simulated current sources coupled in parallel thereto for emulating device noise. The noise may be emulated for all noisy devices together or for some subset of the noisy devices (e.g., any number of the three noisy devices).

Figure 3C:
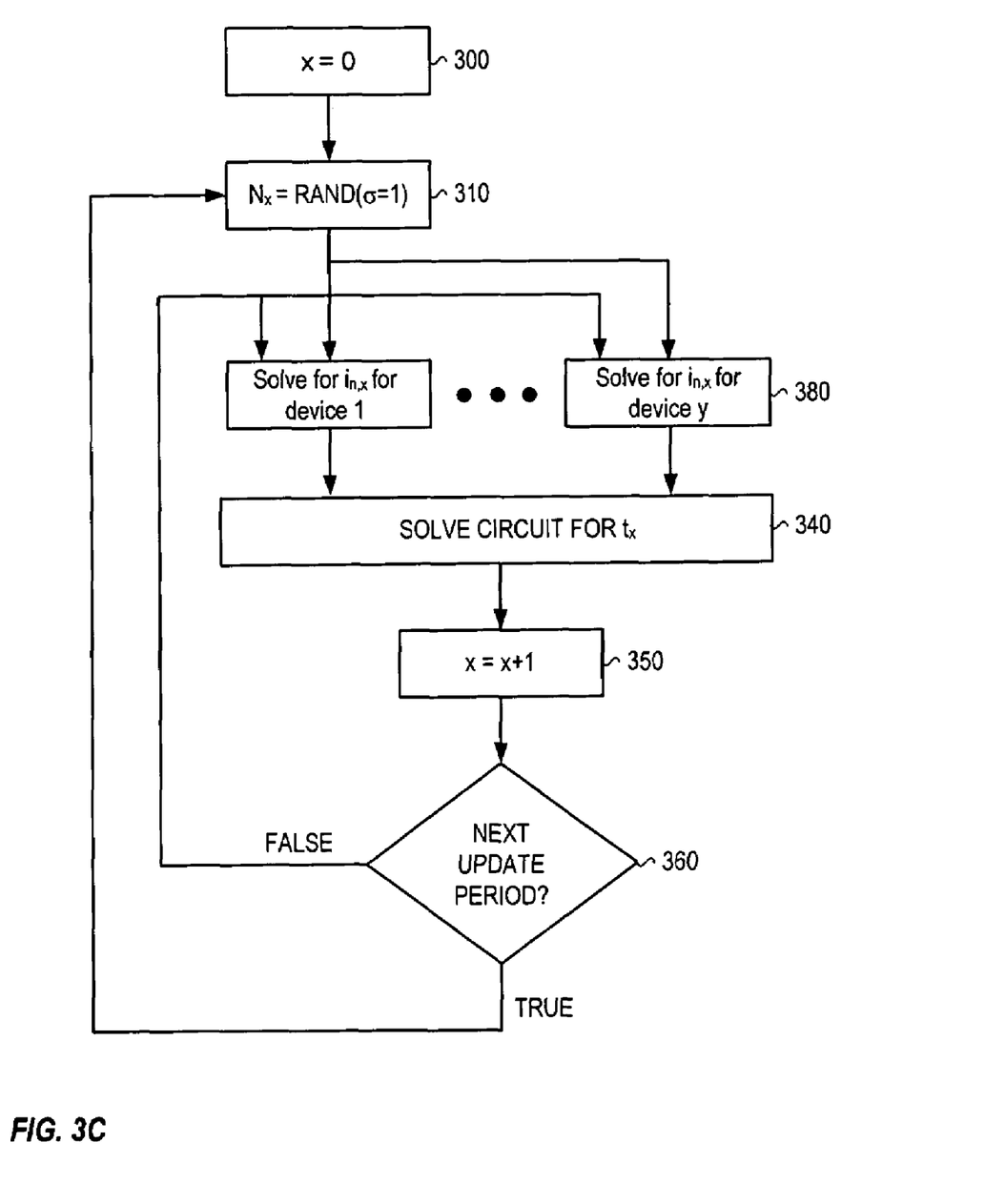
FIG. 3C illustrates an example computational flowchart for implementing a time-domain thermal noise technique, according to one embodiment.

FIG. 3C illustrates an example computational flowchart for implementing a time-domain thermal noise simulation (e.g., for the simulated circuit of FIG. 3B). $N_x$ is selected (310) and used to generate the $i_{n,x}$ for each of the noisy devices 1 through y (380). The generation of $i_{n,x}$ for each of the noisy devices may entail retrieving an appropriate $S_{in}$ for the noisy device having $V_{bias}$ at $t_x$. $\sigma_x$ may be generated for each of the noisy devices (e.g., 320 of FIG. 3A) and used to determine $i_{n,x}$ for each noisy device (e.g., 330 of FIG. 3A). If it is not an update period (360 False) the $i_{n,x}$ may stay the same for each noisy device (e.g., 370 of FIG. 3A).

It should be noted that the same $N_x$ need not be selected for each noisy device. Rather each noisy device may generate a separate $N_x$ (310).

FIGS. 1-3 have focused on white thermal noise (noise that is frequency independent). Unlike thermal noise, flicker noise is characterized by a noise power spectral density that is inversely proportional to frequency, hence it is also referred to as 1/f noise. The roll-off of the filtered noise source illustrated in FIG. 2 is not a good approximation to the 1/f characteristic of flicker noise because it rolls off faster than 1/f and does not monotonically approach zero.

Figure 4:
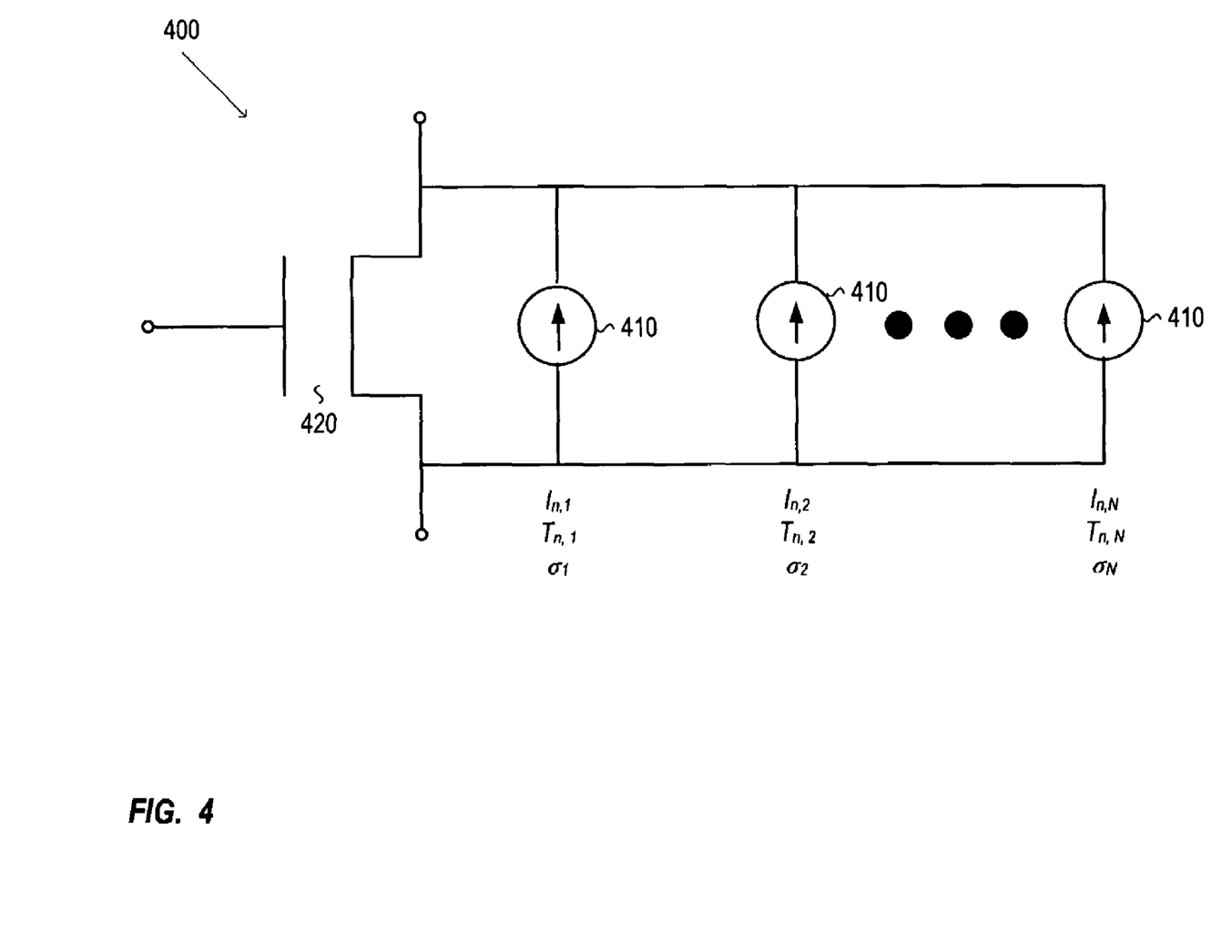
FIG. 4 illustrates an example time domain flicker noise simulation, according to one embodiment.

FIG. 4 illustrates an example time domain flicker noise simulation 400. The simulation 400 includes multiple independent simulated current sources 410 in parallel with each other and a simulated device channel 420. The simulation 400 utilizes the current sources 410 to emulate device noise by injecting appropriate random noise currents to the device 420 at each time point. By systematically choosing the number (N) of current sources 410 ($I_{n,1} \ldots I_{n,N}$), and the rms current ($\sigma_1 \ldots \sigma_N$) and the noise update time ($T_n, T_{n,N}$) associated with each current source 410, the aggregate noise shape can be made to approximate flicker noise for the device 420 over a given frequency range.

The number and properties of the current sources 410 may be determined based on the parameters of the simulation 400. First, a frequency range must be chosen over which to emulate flicker noise. A minimum frequency ($f_{1/f,Tmax}$) is the frequency below which the noise spectrum will be flat and a maximum frequency ($f_{1/f,Tmin}$) is the frequency above which the noise spectrum will begin to roll off faster than 1/f. The minimum and maximum frequencies are inversely proportional to maximum and minimum noise update times of the current sources ($T_{n,max}$ and $T_{n,min}$) respectively. Given a desired frequency range, the $T_{n,max}$ and $T_{n,min}$ can be calculated as the inverse of three times the $f_{1/f,Tmax}$ and the $f_{1/f,Tmin}$ respectfully, such that $T_{n,max}=1/(3*f_{1/f,Tmin})$ and $T_{n,min}=1/(3*f_{1/f,Tmax})$.

Once the $T_{n,max}$ and the $T_{n,min}$ are determined, the number of current sources N and their respective update times ($T_{n,1} \ldots T_{n,N}$) can be calculated. The first and last current sources ($I_{n,1}$ and $I_{n,N}$) may be assigned to $T_{n,min}$ and $T_{n,max}$ respectively and the other current sources may be distributed therebetween. For example, the current sources 410 may be assigned exponentially between $T_{n,min}$ and $T_{n,max}$.

Figure 5:
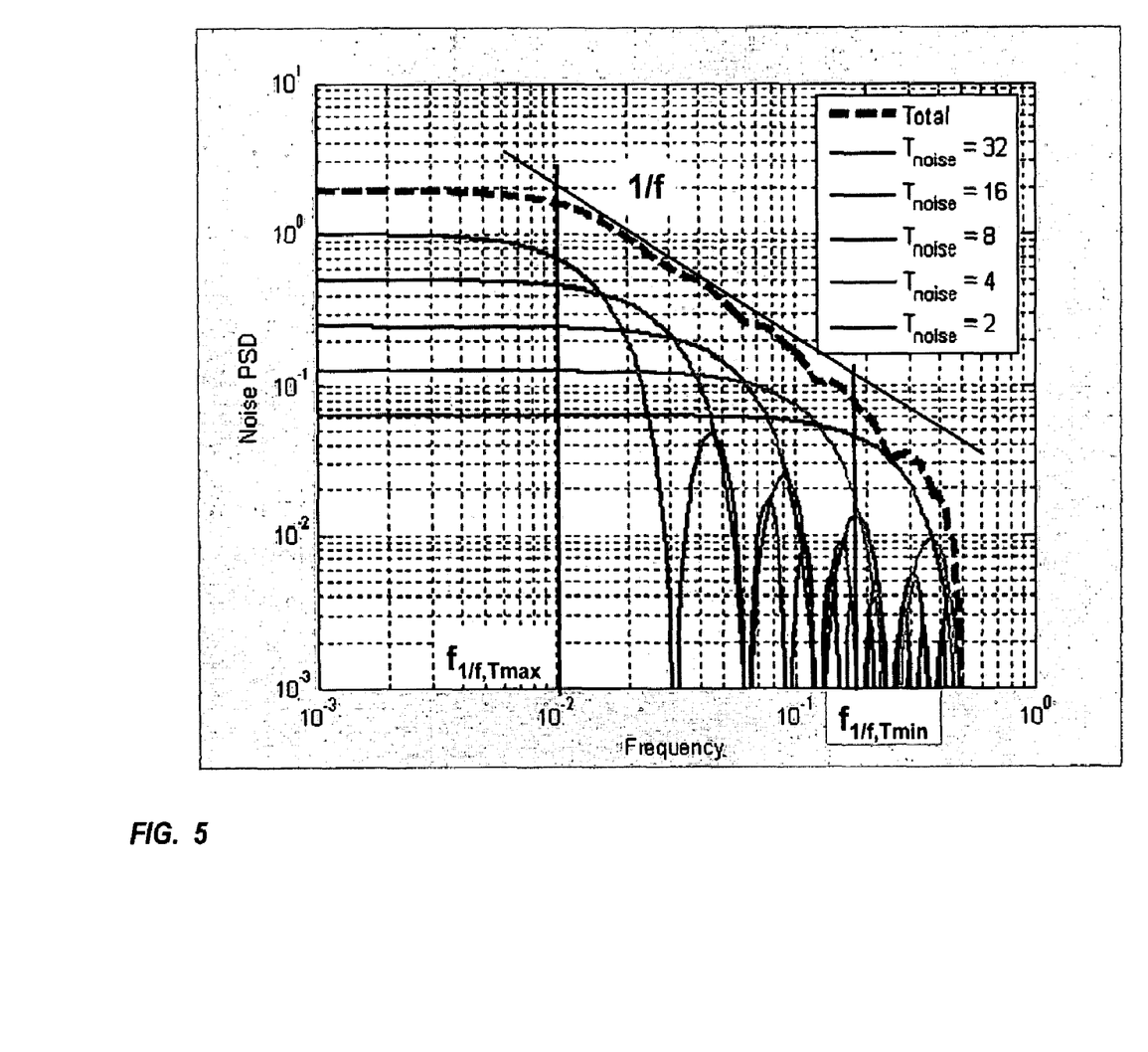
FIG. 5 illustrates an example flicker noise spectrum, according to one embodiment.

FIG. 5 illustrates an example flicker noise spectrum. A minimum frequency ($f_{1/f,Tmax}$) is indicated on the graph as approximately $10^{-2}$ and a maximum frequency ($f_{1/f,Tmin}$) is indicated on the graph as approximately $1.7*10^{-1}$. The corresponding minimum and maximum noise update time scales the simulation step size by 2 and 32 respectively, resulting in $T_{n,min}$ and $T_{n,max}$. Five 5 current sources were utilized to create the flicker noise. A first current source ($I_{n,1}$) has an update time ($T_{n,1}$) assigned to the $T_{n,min}$, a last current source ($I_{n,5}$) has an update time ($T_{n,5}$) assigned to the $T_{n,max}$, and the 3 middle current sources ($I_{n,2} \ldots I_{n,4}$) have update times ($T_{n,2} \ldots T_{n,4}$) distributed therebetween by factors of two (simulation step size scaled by 4, 8 and 16). The combination of the 5 current sources tracks 1/f.

The number of current sources and the frequency range will determine how smooth the resulting 1/f noise spectrum is. Using a factor of about two between the update times tends to yield smooth looking curves, but this can be sacrificed for the purpose of reducing the number of current sources needed for a simulation.

Figure 6A:
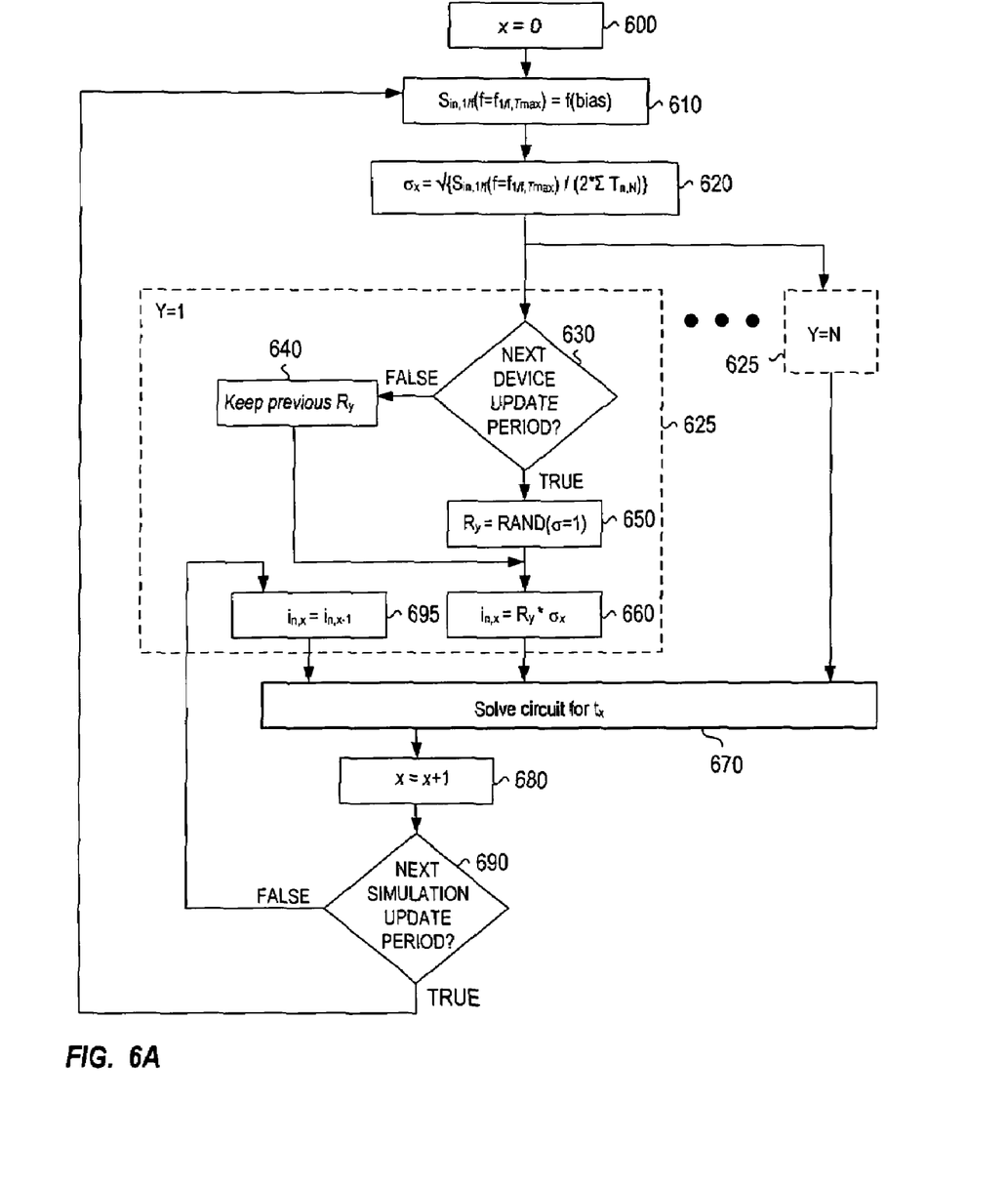
FIG. 6A illustrates an example computational flowchart for implementing a time-domain flicker noise technique, according to one embodiment.

FIG. 6 illustrates an example computational flowchart for implementing a time-domain flicker noise simulation (e.g., 400 of FIG. 4). For a first time step ($t_x$) a variable x is set to zero (600). The flicker noise power spectral density for the minimum 1/f frequency ($S_{in,1/f}(f=f_{1/f,Tmax})$) is determined from the circuit simulator (610). The standard deviation of the flicker noise at this time step ($\sigma_x$) is determined by taking the square root of $S_{in,1/f}(f=f_{1/f,Tmax})$ divided by twice the sum of the noise update times ($T_n$) for the N current sources, such that $\sigma_x=\sqrt{\{(S_{in,\ 1/f}(f=f_{1/f,Tmax})/(2*\Sigma T_{n,N})\}}$ (620). Due to the inverse relationship between the low-frequency noise spectral density and noise bandwidths of the sources, the noise variance is independent of noise update times of the current sources. Accordingly, the $\sigma_x$ is then used to update the current for each of the N current noise sources (625).

For each current noise source (y=1 to N), a determination is made as to whether the next device update period has been reached (630). If the next update period has been reached (630 True) then a new Gaussian random value ($R_y$) is generated with a standard deviation of unity for the time step (650). If the next update period has not yet been reached (630 False) the previous random number generated for this current source is maintained. Regardless of whether a new random number is generated or the old random number is maintained, a noise current for the time step ($i_{n,x}$) is determined by multiplying the random number $R_y$ by the standard deviation $\sigma_x$ (660). As each current source has a different noise update time associated therewith a new random number will not be generated for each current source for each update cycle.

Figure 6B:
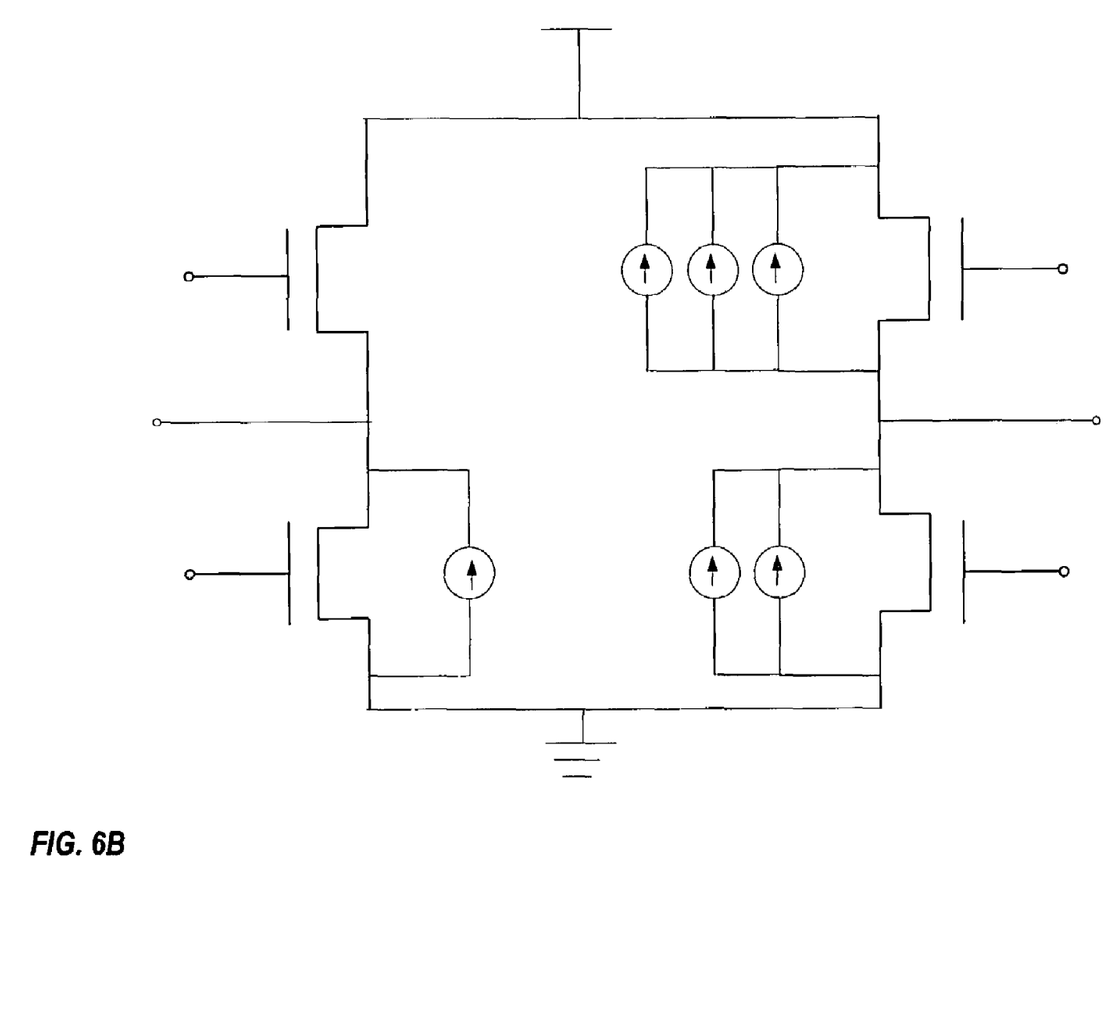
FIG. 6B illustrates an example time domain flicker noise simulation for a simulated circuit, according to one embodiment.

Noise may be emulated for multiple simulated devices making up a simulated circuit. For example, FIG. 6B illustrates a simulated circuit having four simulated transistors coupled together. Three of the simulated transistors have one or more simulated current sources coupled in parallel thereto for emulating device noise. The noise may be emulated for all noisy devices together or for some subset of the noisy devices (e.g., any number of the three noisy devices). Note that for ease of illustration the flow chart does not include separate flows for each noisy device.

After $i_{n,x}$ generated for each current source in each noisy component, the circuit is then solved for time $t_x$ with the application of $i_{n,x}$ for each current source (670). At a next time step the variable x is increased by 1 (680) and then a determination is made as to whether the next simulation update period has been reached (690). If the next update period has been reached (690 True) a new $S_{in,\ 1/f}(f=f_{1/f,Tmax})$ is determined for the time step (610). If the next update period has not yet been reached (690 False) a noise current for that time step $i_{n,x}$ set to the noise current for the previous time step $i_{n,x-1}$ (695).

Determination 690 applies the same update time $T_{update}$ to each current source even though each current source has its own noise update time $T_n$. $T_{update}$ is used to determine how often the simulator should update the current source variances to reflect changes in the device bias condition. This is essential since $T_{n,y}$ will often exceed the rise and fall time of signals in the simulation. In fact, it may be orders of magnitude larger than the clock period in the case of VCO simulations. Therefore, the bias condition of the device, and hence its noise contribution, change significantly and its noise contribution must change to reflect this. $T_{update}$ may be $T_{min}$ or less so that no updates to the current source having the smallest noise update time are missed.

It is often desired to simulate both flicker and thermal noise together in the same simulation. This can be achieved by adding an additional thermal noise source in parallel with the flicker noise sources. Since the noise components are independent, their power spectral densities will be superimposed, adding linearly to each other. In fact, generating thermal noise is simply a special case of the flicker noise simulation where only one noise source is used. The same $T_{update}$ can even be used for the flicker and thermal noise sources.

Figure 7:
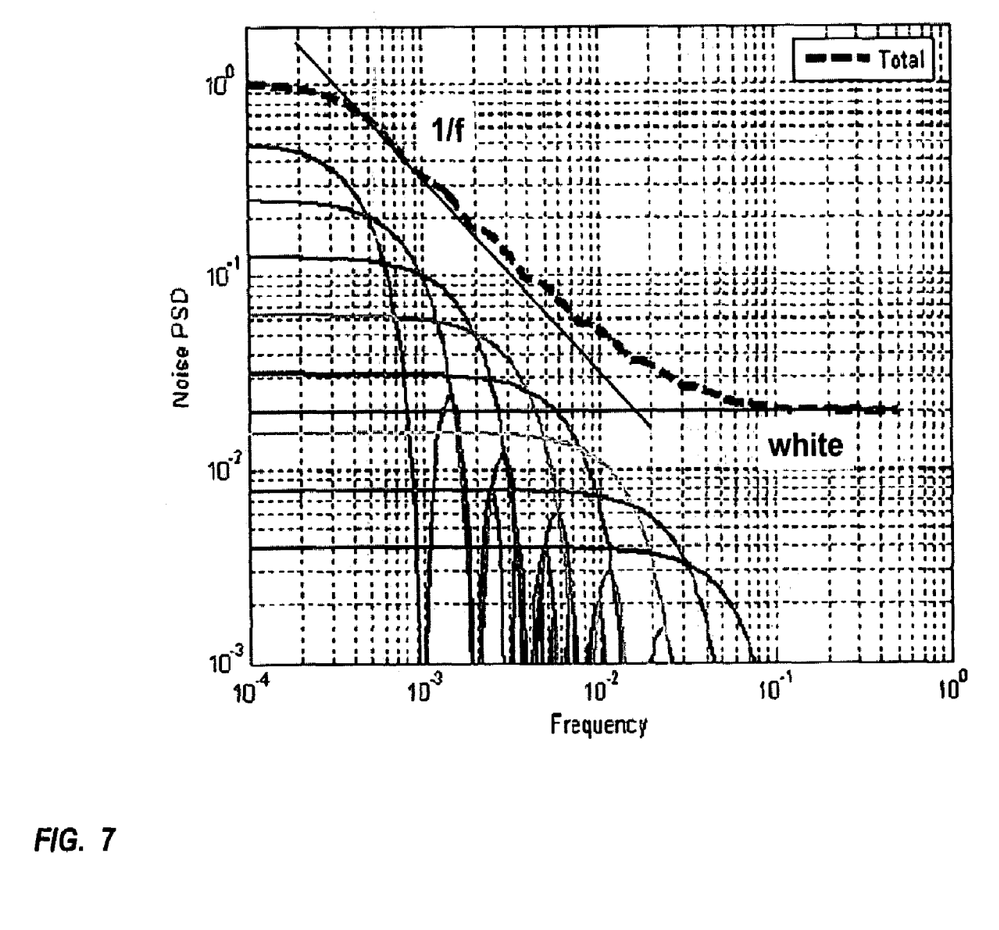
FIG. 7 illustrates an example thermal and flicker noise spectrum, according to one embodiment.

FIG. 7 illustrates an example thermal and flicker noise spectrum. The noise spectrum has a flicker portion that tracks along the 1/f slope and a thermal portion that tracks the white noise.

A time domain noise simulator for generating noise simulations to emulate device noise (e.g., perform the functional flows of FIGS. 3A, 3C and 6A) has the capability of simulating thermal and/or flicker noise for large-signal circuits by using an ensemble of current sources in parallel to a device to emulate the noise spectrum of thermal and flicker noise in the time domain. According to one embodiment, noise may be emulated using an ensemble of voltage sources in series with a device to emulate the noise spectrum of thermal and flicker noise in the time domain.

The time domain noise simulator is capable of emulating any noise spectrum that is either frequency independent or monotonically decreases with increasing frequency. The time domain noise simulator emulates bias-dependent noise which facilitates noise simulations of large-signal circuits. For example, the time domain noise simulator accounts for the modulation of flicker and thermal device noise by switching devices in a VCO. The time domain noise simulator allows for noise to be included for all devices in a simulated circuit or to have the noise enabled/disabled for individual devices in the circuit. The time domain noise simulator utilizes an update interval ($T_{update}$) for the current sources to avoid problems that may be associated with varying time steps. A user may control the noise bandwidth to aid in convergence and speed up simulations.

The time domain noise simulators may be compatible with time domain circuit simulators (e.g., SPICE) with minimal computational overhead. The time domain noise simulator may use standard device models (e.g., BSIM) and/or proprietary device models to obtain parameters about the devices (e.g., $S_{in}$) necessary to emulate the noise for the device(s). The time domain noise simulator may be incorporated into circuit simulators so that simulating noise in the time domain is part of a time domain circuit simulation.

Figure 8:
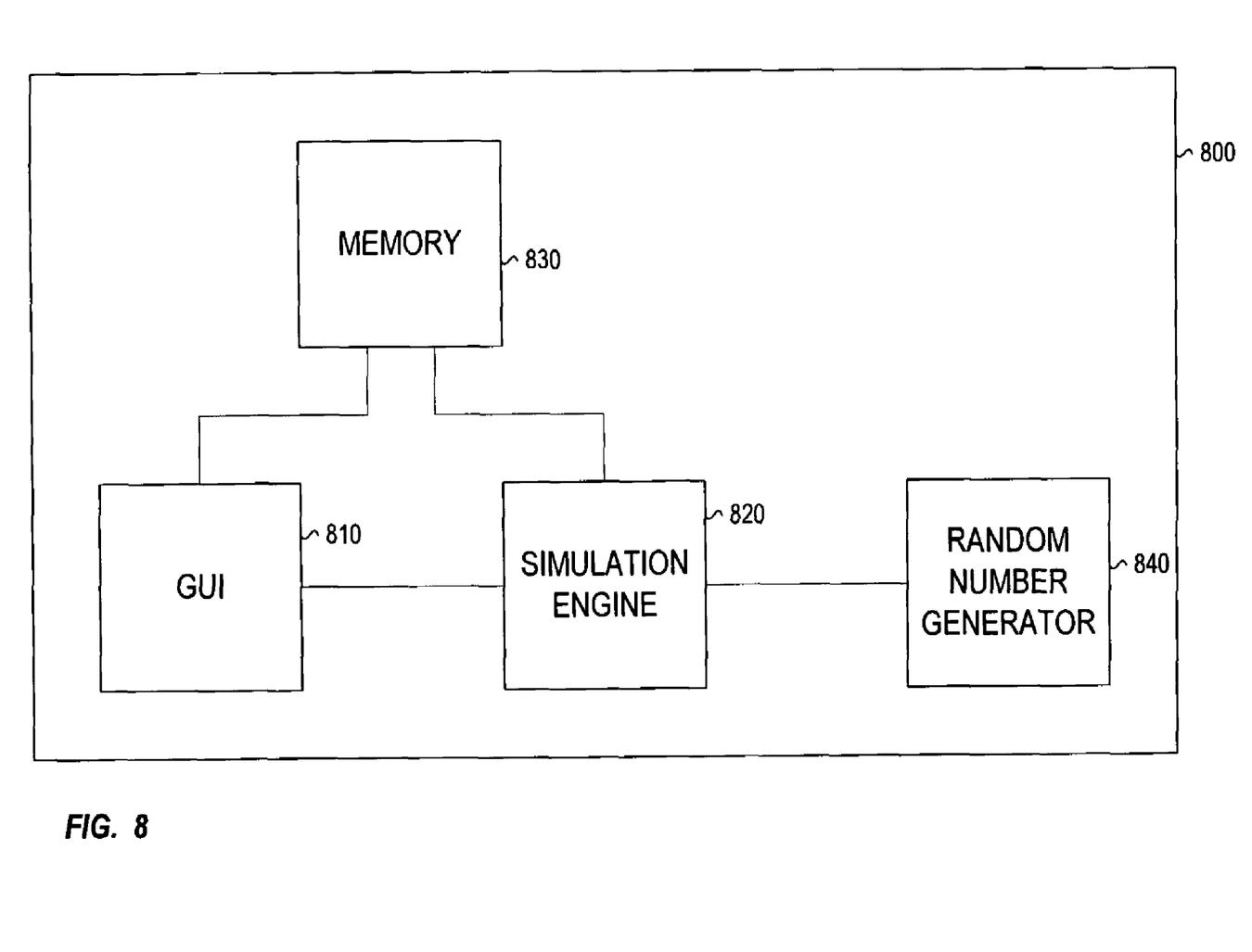
FIG. 8 illustrates an example functional block diagram of a time domain circuit simulator, according to one embodiment.

FIG. 8 illustrates an example functional block diagram of a time domain circuit simulator 800. The simulator may include a user interface (UI) 810, a simulation engine 820 and memory 830. The UI 810 may enable a user to enter data, initiate actions, and review results. The memory 830 may include a library of known devices and the parameters associated therewith. The UI 810 may be used to select known devices from the library for inclusion in a simulated circuit. The UI 810 may be used to modify the simulated circuits to couple one or more current sources to noisy devices based on parameters about the devices. The simulated circuits may be stored in the memory 830. The simulation engine 820 may run simulations on the simulated circuits. The simulation engine 820 may emulate noise by implementing the functions described herein. The simulator 800 may include a random number generator 840.

The various embodiments described herein may be machine-readable instructions that can be provided to a machine (e.g., an ASIC, special function controller or processor, FPGA or other hardware device) from a form of machine-accessible medium. A machine-accessible medium may represent any mechanism that provides (i.e., stores and/or transmits) information in a form readable and/or accessible to the machine. For example, a machine-accessible medium may include: ROM; RAM; magnetic disk storage media; optical storage media; flash memory devices; electrical, optical, acoustical or other form of propagated signals (e.g., carrier waves, infrared signals, digital signals); and the like. In other embodiments, the simulators may be different combinations of hardware, firmware, and/or software.

Although the various embodiments have been illustrated by reference to specific figures, it will be apparent that various changes and modifications may be made without departing from the scope. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A machine-readable storage medium storing computer executable instructions, which, when executed by a machine causes the machine to
    simulate a circuit made up of a plurality of simulated devices, wherein the plurality of simulated devices includes a plurality of simulated noisy devices,
    couple a plurality of simulated current sources in parallel to the plurality of simulated noisy devices,
    selectively activate a combination of the plurality of simulated current sources to apply a combination of random current values to different combinations of the plurality of simulated noisy devices at discrete noise update times to simulate device noise for the different combinations, and
    update noise current values of the simulated circuit at simulation update times.

2. The machine-readable storage medium storing computer executable instructions of claim 1, which when executed by the machine causes the machine to apply the combination of random current values based on device noise standard deviations at the noise update times.

3. The machine-readable storage medium storing computer executable instructions of claim 2, which when executed by the machine causes the machine to derive the device noise standard deviations from noise power spectral densities for the simulated noisy devices.

4. The machine-readable storage medium storing computer executable instructions of claim 3, which when executed by the machine causes the machine to associate the power spectral densities with bias of the simulated noisy devices at those noise update times.

5. The machine-readable storage medium storing computer executable instructions of claim 1, which when executed by the machine causes the machine to utilize a single simulated current source to simulate thermal noise for a particular simulated noisy device.

6. The machine-readable storage medium storing computer executable instructions of claim 1, which when executed by the machine causes the machine to utilize a plurality of simulated current sources having different noise update times to simulate flicker noise for a particular simulated noisy device.

7. The machine-readable storage medium storing computer executable instructions of claim 6, which when executed by the machine causes the machine to derive the simulation update times from the frequency range of the flicker noise.

8. A machine-readable storage medium storing computer executable instructions, which, when executed by a machine causes the machine to
    couple a plurality of simulated current sources in parallel to a plurality of simulated noisy devices in a simulated circuit;
    selectively activate a combination of the plurality of simulated current sources to simulate noise for different combinations of the plurality of simulated noisy devices;
    detect a next simulated noisy device noise update time;
    at the detected noise update time:
    generate a random number;
    retrieve a noise power spectral density for one of the plurality of simulated noisy devices having certain bias conditions;
    generate a noise standard deviation based on the noise power spectral density and the simulation device noise update time;
    generate a random current, based at least partially on the noise standard deviation and the random number; and
    apply the random current to the one of the plurality of simulated noisy devices; and
    update noise current values of the simulated circuit at simulation update times.

9. The machine-readable storage medium storing computer executable instructions of claim 8, which when executed by the machine further causes the machine to maintain the random current for next simulation time steps until the next simulation noise update time is detected.

10. A time domain circuit simulator comprising:
    a processor;
    a storage medium;
    a user interface to select a plurality of simulated current sources to be coupled in parallel with a plurality of simulated noisy devices making up a simulated circuit; and
    a simulation engine to
    simulate device noise by selectively applying a combination of random current values to a combination of the simulated noisy devices at discrete noise update times; and
    update noise current values of the simulated circuit at simulation update times,
    wherein a single simulated current source is utilized to simulate thermal noise for a particular simulated noisy device and a plurality of simulated current sources having different simulation update times are used to simulate flicker noise for a particular simulated noisy device.

11. The simulator of claim 10, further comprising a random number generator to generate a random number at the simulation device noise update times; and
    a library of device models containing parameters about different devices including noise related parameters to be used by the simulation engine to calculate power spectral density at different bias conditions, wherein the random current values for the simulated current sources are based on the random number, the noise power spectral densities for the corresponding noisy devices having certain bias conditions, and the simulation device noise update times for the corresponding noisy devices.

12. The simulator of claim 10, wherein the simulation engine is to retrieve a random number;

retrieve a noise power spectral density for a simulated noisy device having certain bias conditions;

generate a noise standard deviation based on the noise power spectral density and the simulation device noise update time;

generate a random current, based at least partially on the noise standard deviation and the random number; and apply the random current to the simulated noisy device.

13. A time domain noise simulator comprising a processor;

a storage medium;

a user interface to select a plurality of simulated voltage sources to be coupled in series to a plurality of simulated noisy devices that is part of a simulated circuit, and a simulation engine to simulate device noise by selectively applying a combination of random voltage values to a combination of simulated noisy devices at discrete noise update times; and update noise voltage values of the simulated circuit at simulation update times, wherein a single simulated voltage source is utilized to simulate thermal noise for a particular simulated noisy device and a plurality of simulated voltage sources having different noise update times are used to simulate flicker noise for a particular simulated noisy device.

14. The simulator of claim 13, wherein the simulation engine bases the random voltage value on a devise noise standard deviation at the noise update times.

* * * * *